United States Patent [19]

Sasaki et al.

[11] Patent Number: 5,063,355

[45] Date of Patent: Nov. 5, 1991

[54] TIMER CIRCUIT

[75] Inventors: Kazuo Sasaki, Osaka; Hidetoshi Matsumoto, Kyoto; Taneji Ohoka, Siga, all of Japan

[73] Assignee: Omron Corporation, Kyoto, Japan

[21] Appl. No.: 489,948

[22] Filed: Mar. 9, 1990

[30] Foreign Application Priority Data

Mar. 13, 1989 [JP] Japan .................................... 1-60279

[51] Int. Cl.[5] ..................... H03K 17/296; G04F 15/00

[52] U.S. Cl. .............................. 328/129.1; 307/296.3; 377/20

[58] Field of Search ........................ 377/20; 328/129.1; 307/296.3

[56] References Cited

U.S. PATENT DOCUMENTS 3,936,745 2/1976 Harrington ........................ 328/129.1
4,052,676 10/1977 Crittenden ............................ 377/20
4,545,686 10/1985 Ushikoshi .............................. 368/63
4,745,629 5/1988 Essig et al. ............................ 377/20
4,814,905 3/1989 Hashimoto ....................... 328/129.1
4,968,907 11/1990 Pepper ............................ 328/129.1

FOREIGN PATENT DOCUMENTS 54-148361 11/1979 Japan .
60-111180 6/1985 Japan .

*Primary Examiner*—John S. Heyman
*Attorney, Agent, or Firm*—Fish & Richardson

[57] ABSTRACT

The timer circuit according to this invention has a first circuit block to which a source voltage is applied at all times and which includes a memory circuit which is set when an input signal is applied thereto. The timer circuit also has a reference voltage circuit which outputs a reference voltage when the memory circuit is set and which ceases to output the reference voltage when the memory circuit is reset, an oscillation circuit which outputs a train of pulse signals in a predetermined cycle, and a counter which begins to count the train of pulse signals after the reference voltage is outputted. The timer circuit further includes a second circuit block which includes a signal processing circuit which outputs a timer signal while the counter is counting. A reference voltage is supplied from the reference voltage circuit to the components of the second circuit block while the memory circuit remains set and the memory circuit is reset in response to a time-out signal from the counter.

6 Claims, 2 Drawing Sheets

TIMER CIRCUIT

BACKGROUND OF THE INVENTION

1. Field of the Invention

The present invention relates to an improved timer circuit and more particularly to a timer circuit with minimized power consumption.

2. Brief Description of the Prior Art

ID a prior art timer circuit, a built-in counter responding to a certain input signal counts a train of pulse signals from an oscillator. In addition, a built-in signal processor receiving the counter output produces a timer signal corresponding to the counting duration of the counter. Generally, the timing of application of an input signal varies according to the device in which the timer circuit is incorporated. Therefore, the circuit must be in standby condition at all times, i.e. it must always be ready to function properly irrespective of the timing of application of the input signal.

In accordance with the above, the timer circuit is designed so that in the standby condition a source voltage is continuously applied to its respective components, including the oscillator, the counter, and the signal processor. Thus if an input signal is not applied for a long time, the standby condition of the timer circuit inevitably results in costly power consumption.

OBJECTS OF THE INVENTION

It is an object of the present invention to provide a timer circuit which consumes only a minimum amount of electric power during the period in which no input signal is applied.

SUMMARY OF THE INVENTION

The timer circuit according to the present invention comprises a first circuit block to which a source voltage is applied at all times and which includes a memory circuit which is set when an input signal is applied thereto. The timer circuit also comprises a reference voltage circuit which outputs a reference voltage wherein the memory circuit is set and ceases to output the reference voltage when the memory circuit is reset, an oscillation circuit which outputs a train of pulse signals in a predetermined cycle, and a counter which begins to count the train of pulse signals after the reference voltage is outputted. The timer circuit further comprises a second circuit block which includes a signal processing circuit which outputs a timer signal while the counter is counting. A reference voltage is supplied from the reference voltage circuit to the circuits of the second circuit block while the memory circuit remains set and the memory circuit is reset in response to a time-out signal from the counter.

In this timer circuit, the memory circuit remains reset while there is no input signal so that the reference voltage circuit does not apply a reference voltage to various components of the second circuit block. Upon application of an input signal, the memory circuit is set and accordingly the reference voltage circuit outputs a reference voltage. When the reference voltage is fed to the components of the second circuit block, the counter starts counting pulse signals from the oscillator. In response to the counter output, the signal processing circuit outputs a timer signal until the counter has timed out. When the counter times out, the memory circuit is reset and accordingly the reference voltage circuit ceases to output the reference voltage and stands by until the next input signal is applied. In this timer circuit, the source voltage is supplied to the various components of the second circuit block only while the counter is counting.

BRIEF DESCRIPTION OF THE DRAWINGS

Other objects and advantages of the invention will become apparent from the following description and accompanying drawings.

DETAILED DESCRIPTION OF THE PREFERRED EMBODIMENTS

The following embodiments are illustrative of the invention in further detail.

Figure 1:
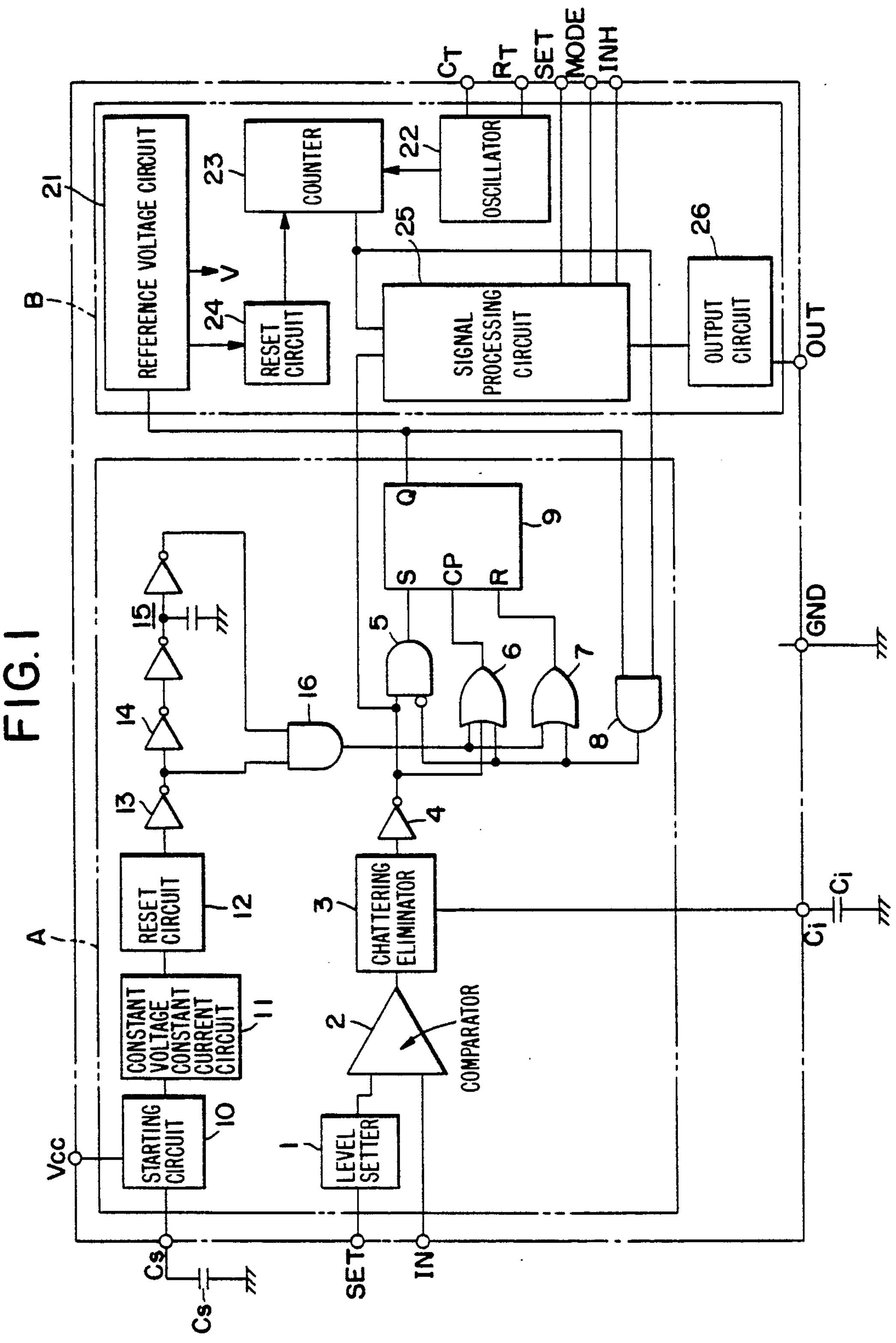
FIG. 1 is a block diagram showing a timer circuit according to one embodiment of the invention.

FIG. 1 is a block diagram of one timer circuit embodying the principle of the invention. This timer circuit is thoroughly constituted as an integrated circuit (IC) package. Structurally, the timer circuit consists of a first circuit block A and a second circuit block B. The first block A is supplied with a source voltage from an external source, while the reference voltage (source voltage) is fed to respective components of the second block B only while a timer signal is available.

The first block A comprises, as built therein, a level setting circuit 1 which is used to adjust and set the level of the reference voltage to be applied to a SET terminal, a comparator 2 for comparing the reference voltage with the input voltage, a chattering eliminator 3, an invertor 4, an inhibit gate 5, OR gates 6 and 7, an AND gate 8, a flip-flop 9 which is set to perform a memory function as an input signal not lower than the reference voltage is applied to an IN terminal, a starting circuit 10, a constant voltage constant current circuit 11, a reset circuit 12, invertors 13 and 14, a clock oscillator 15 and an AND gate 16.

The second block B comprises, as built therein, a reference voltage circuit 21 which outputs a reference voltage V in response to the set output of the flip-flop an oscillator 22 for generating pulse signals, a counter 23 which counts said pulse signals, a reset circuit 24 which resets the counter 23 in response to the reference voltage from said reference voltage circuit 21, a signal processing circuit 25 adapted to output a timer signal during the period from the application of an input signal to the time-out of the counter 23, and an output circuit 26. The reference voltage V from the reference voltage circuit 21 is fed to the oscillator 22, counter 23, reset circuit 24, signal processing circuit 25 and output circuit 26.

Functions of the timer circuit according to the above embodiment are explained below.

Now, in the condition that no input signal is available at the input signal terminal IN, the signal outputted from the comparator circuit 2 through the chattering eliminator and invertor 4 is L (low), so that even if an input of L level is available at the prohibit input terminal of the inhibit gate 5, its output is L (low). Therefore, the flip-flop 9 is not set and the set output Q is also at L level. Accordingly, the reference voltage circuit 21 does not output a reference voltage V and, therefore, no voltage is applied to the respective components of the second block B. This means that there is no power consumption by the components of the second block B.

As an input signal is applied to the input signal terminal IN, the output of the invertor 4 goes high. Therefore, a high-level signal is derived at the output of the inhibit gate 5 and the flip-flop g is set. Accordingly, the set output Q goes high. In response to this set output Q, the reference voltage circuit 21 outputs a reference voltage V, whereby the respective component circuits of the second block B are rendered operative. Thus, a pulse signal is produced from the oscillator 22 and counted by the counter 23. The signal processing circuit 25 receiving the high signal indicating the application of an input signal from the invertor 4 begins to output a timer signal to the output terminal OUT through the output circuit 26 from the beginning of counting by the counter 23. When the counter 23 times out, the signal processing circuit 25 outputs a low-level signal, that is to say turns off the timer signal.

When a time-out signal is available from the counter 23, one of the inputs of AND gate 8 is high because of the Q output of flip-flop 9, while the other input is high because of the count-up signal and this high signal is applied to the reset terminal of flip-flop g through OR gate 7 so that the flip-flop 9 is reset again. Upon resetting, the set output Q becomes low, so that the reference voltage circuit 21 ceases to output the reference voltage V, with the result that no voltage is supplied to the respective component circuits of the second block B. Thus, no power consumption occurs in this block.

In this timer circuit, therefore, when an input signal is applied, a voltage is supplied to the respective components of the second block B. When the timer signal is turned off, the supply of voltage to the respective component circuits of the second block B is suspended. In other words, the source voltage is supplied only when the timer signal is outputted and no power supply to block B takes place at other times. Therefore, the power consumption in the second block B is minimized.

Figure 2:
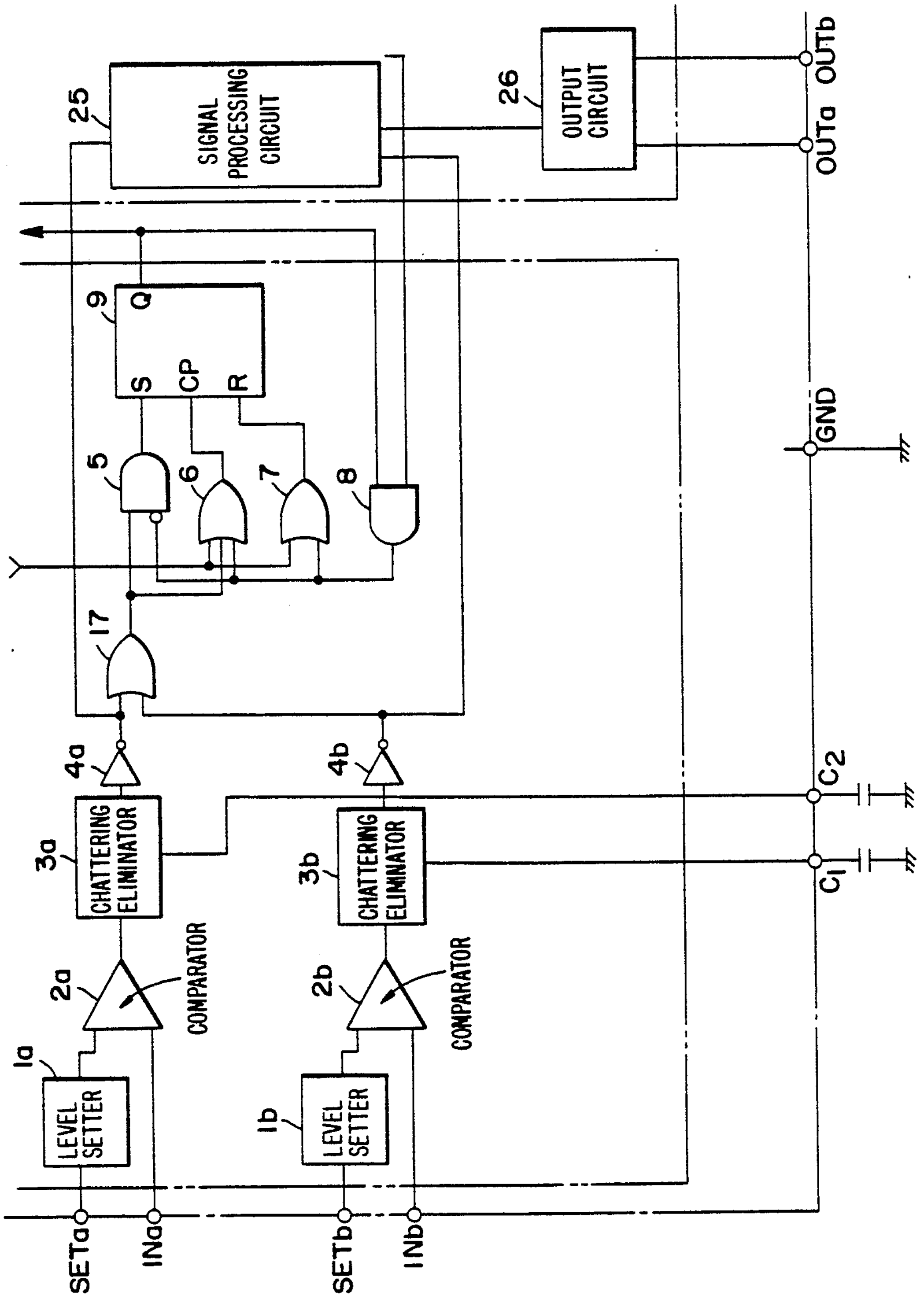
FIG. 2 is a block diagram showing a timer circuit according to another embodiment of the invention.

FIG. 2 is a block diagram showing a part of the timer circuit according to another embodiment of the invention. This timer circuit is a dual input system. Thus, this system comprises a couple of like circuits, namely an input circuit comprising a level setting circuit 1*a*, a comparator 2*a*, a chattering eliminator 3*a* and invertor 4*a* and an input circuit comprising a level setting circuit 1*b*, a comparator 2*b*, a chattering eliminator 3*b* and an invertor 4*b*, and outputs from the invertors 4*a*, 4*b* are fed to the inhibit gate 5 through an OR gate 17. In addition, an output circuit 26 is provided having two output terminals OUTa and OUTb. The other circuit components are the same as those described for the timer circuit shown in FIG. 1.

In this timer circuit, as an input signal is supplied to one of the two input terminals, the flip-flop 9 is set and the reference voltage circuit 21 supplies voltage to the respective circuits of the second block B. The signal processing circuit 25 outputs a timer signal until the counter 23 stops counting from the output terminal corresponding to the input terminal to which a signal has been applied.

Thus, the timer circuit of the invention comprises a first circuit block including a memory circuit which is set as an input signal is applied thereto, a second circuit block including a reference signal circuit adapted to output a reference voltage in response to a set output at the memory circuit, the reference voltage driving the second circuit block and the memory circuit being reset on time-out of the counter in the second circuit block, the source power being fed to respective components of the second circuit block while a timer signal is outputted, with no power being supplied at other times so that no power consumption takes place in the second circuit block in normal state, thus leading to a marked decrease in the overall power consumption.

The above description and the accompanying drawings are merely illustrative of the application of the principles of the present invention and are not limiting. Numerous other arrangements which embody the principles of the invention and which fall within its spirit and scope may be readily devised by those skilled in the art. Accordingly, the invention is not limited by the foregoing description, but is only limited by the scope of the appended claims.

What is claimed is:

1. A timer circuit comprising:
   - a first circuit block which is supplied with a source voltage at all times and comprising a memory circuit which is set when an input signal is applied thereto;
   - a second circuit block comprising a reference voltage circuit which outputs a reference voltage when said memory circuit is set and which ceases to output the reference voltage when said memory circuit is reset,
   - an oscillation circuit which outputs a train of pulse signals in a predetermined cycle,
   - a counter which starts counting said train of pulse signals when said reference voltage is outputted and which stops counting when a predetermined number of said pulse signals have been counted, and
   - a signal processing circuit which outputs a timer signal while said counter is counting;
   - wherein said reference voltage supplied by said reference voltage circuit is applied to power said second circuit block while the memory circuit remains set, wherein said memory circuit is reset in response to a time-out signal from said counter.

2. A timer circuit according to claim 1, where said memory circuit comprises a flip-flop.

3. A timer circuit according to claim 1, where said reference voltage circuit comprises a batter.

4. A timer circuit comprising:
   - a first circuit block which is supplied with a source voltage at all times and comprising a memory circuit which is set by input means for receiving input signals, said input means comprising a plurality of input terminal circuits to receive input signals;
   - a second circuit block comprising a reference voltage circuit which outputs a reference voltage when said memory circuit is set and which ceases to output the reference voltage when said memory circuit is reset,
   - an oscillation circuit which outputs a train of pulse signals in a predetermined cycle,
   - a counter which starts counting said train of pulse signals when said reference voltage is outputted and which stops counting when a predetermined number of said pulse signals have been counted, and
   - a signal processing circuit having timer signal output means which provides timer signal output while said counter is counting, said timer signal output means comprising a plurality of output terminal circuits to produce timer signals output signals corresponding respectively to said input signals;

wherein said reference voltage supplied by said reference voltage circuit is applied to power said second circuit block while the memory circuit remains set, wherein said memory circuit is reset in response to a time-out signal from said counter.

5. A timer circuit according to claim 4, where said memory circuit comprises a flip-flop.

6. A timer circuit according to claim 4, where said reference voltage circuit comprises a battery.

* * * * *